US011335408B2

(12) United States Patent
Sforzin et al.

(10) Patent No.: US 11,335,408 B2
(45) Date of Patent: *May 17, 2022

(54) EVENT COUNTERS FOR MEMORY OPERATIONS

(71) Applicant: Micron Technology, Inc., Boise, ID (US)

(72) Inventors: Marco Sforzin, Cernusco Sul Naviglio (IT); Umberto Di Vincenzo, Capriate San Gervasio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/200,385

(22) Filed: Mar. 12, 2021

(65) Prior Publication Data

US 2021/0202005 A1     Jul. 1, 2021

Related U.S. Application Data

(63) Continuation of application No. 16/927,473, filed on Jul. 13, 2020, now Pat. No. 10,950,308, which is a
(Continued)

(51) Int. Cl.
*G11C 11/34* (2006.01)
*G11C 16/12* (2006.01)
(Continued)

(52) U.S. Cl.
CPC .............. *G11C 16/12* (2013.01); *G11C 7/062* (2013.01); *G11C 7/14* (2013.01); *G11C 11/24* (2013.01);
(Continued)

(58) Field of Classification Search
CPC ........... G11C 16/12; G11C 7/062; G11C 7/14; G11C 11/24; G11C 11/4045; G11C 16/28; G11C 11/5678; G11C 13/0038
(Continued)

(56) References Cited

U.S. PATENT DOCUMENTS 6,188,615 B1 *  2/2001  Perner ................... G11C 7/067
                                                              365/158
6,577,525 B2    6/2003  Baker
                        (Continued)

FOREIGN PATENT DOCUMENTS

CN           1830036 A      9/2006
CN         103714851 A      4/2014
                        (Continued)

OTHER PUBLICATIONS

International Search Report & Written Opinion from related International Application No. PCT/US2019/055283, dated Jan. 22, 2020, 10 pages.
(Continued)

*Primary Examiner* — Viet Q Nguyen
(74) *Attorney, Agent, or Firm* — Brooks, Cameron & Huebsch, PLLC

(57) ABSTRACT

A counter can have a number of sensing components. Each respective sensing component can be configured to sense a respective event and can include a respective first capacitor configured to be selectively coupled to a second capacitor in response to the respective sensing component sensing the respective event. The second capacitor can be configured to be charged to a voltage by each respective first capacitor that is selectively coupled to the second capacitor. The counter can have a comparator with a first input coupled to the second capacitor and a second input coupled to a reference voltage corresponding to a threshold quantity of events. The
(Continued)

comparator can be configured to output a signal indicative of the threshold quantity of events being sensed in response to the voltage of the second capacitor being greater than or equal to the reference voltage.

20 Claims, 8 Drawing Sheets

Related U.S. Application Data continuation of application No. 16/168,952, filed on Oct. 24, 2018, now Pat. No. 10,714,185.

(51) Int. Cl.
| | |
|---|---|
| *G11C 16/28* | (2006.01) |
| *G11C 7/14* | (2006.01) |
| *G11C 11/24* | (2006.01) |
| *G11C 7/06* | (2006.01) |
| *G11C 11/404* | (2006.01) |
| *G11C 13/00* | (2006.01) |
| *G11C 11/56* | (2006.01) |

(52) U.S. Cl.
CPC .......... *G11C 11/4045* (2013.01); *G11C 16/28* (2013.01); *G11C 11/5678* (2013.01); *G11C 13/0038* (2013.01)

(58) Field of Classification Search
USPC ...................................................... 365/185.2
See application file for complete search history.

(56) References Cited

U.S. PATENT DOCUMENTS

| | | | |
|---|---|---|---|
| 6,885,580 B2 | 4/2005 | Baker | |
| 7,151,698 B2 | 12/2006 | Baker | |
| 8,068,046 B2 | 11/2011 | Baker | |
| 8,289,772 B2 | 10/2012 | Baker | |
| 8,737,120 B2 | 5/2014 | Guo | |
| 10,079,986 B1 | 9/2018 | Hairston | |
| 10,236,053 B1* | 3/2019 | Ramaraju | G11C 16/30 |
| 10,424,372 B1 | 9/2019 | Sforzin | |
| 10,431,301 B2 | 10/2019 | Mirichigni | |
| 10,573,372 B2 | 2/2020 | Suzuki | |
| 10,714,185 B2* | 7/2020 | Sforzin | G11C 16/12 |
| 10,950,308 B2* | 3/2021 | Sforzin | G11C 7/062 |
| 2004/0032760 A1 | 2/2004 | Baker | |
| 2012/0057152 A1 | 3/2012 | Eldesouki et al. | |
| 2014/0092694 A1 | 4/2014 | Lam et al. | |
| 2016/0300240 A1* | 10/2016 | Bright | G06Q 30/0601 |
| 2017/0285082 A1* | 10/2017 | Guo | G01R 27/14 |
| 2019/0068215 A1* | 2/2019 | Lesso | H03K 3/02337 |
| 2019/0295669 A1* | 9/2019 | Yang | G11C 16/08 |
| 2020/0073754 A1* | 3/2020 | Zhang | G11C 29/50 |

FOREIGN PATENT DOCUMENTS

| | | |
|---|---|---|
| JP | 2009-222431 A | 10/2009 |
| KR | 10-0747734 B1 | 8/2007 |
| TW | 2004-14190 A | 8/2004 |

OTHER PUBLICATIONS

U.S. Appl. No. 15/853,328, entitled, "Auto-Referenced Memory Cell Read Techniques," filed Dec. 22, 2017, (61 pgs.).
U.S. Appl. No. 15/853,364, entitled, "Auto-Referenced Memory Cell Read Techniques," filed Dec. 22, 2017, (63 pgs.).
Office Action from related Taiwanese patent application No. 108137593, dated Nov. 6, 2020, 9 pages.
First Office Action from related Chinese Patent Application No. 201980066449.9, dated Aug. 3, 2021, 10 pages.

* cited by examiner

EVENT COUNTERS FOR MEMORY OPERATIONS

PRIORITY INFORMATION

This application is a Continuation of U.S. application Ser. No. 16/927,473, filed on Jul. 13, 2020, which will issue as U.S. Pat. No. 10,950,308 on Mar. 16, 2021, which is a Continuation of U.S. application Ser. No. 16/168,952, filed on Oct. 24, 2018, and issued as U.S. Pat. No. 10,714,185 on Jul. 14, 2020, the contents of which are incorporated herein by reference.

TECHNICAL FIELD

The present disclosure relates generally to electronic apparatus, and more particularly, to event counters for memory operations.

BACKGROUND

Electronic systems, such as memory systems, can experience a number of events, such as voltage changes, switching events, and the like. For example, voltages on the lines of a bus, such as a data bus of a memory system, can change. The voltages of registers, such as data registers of a memory system, can change as a result of the data values in the registers changing. In some examples, memory systems can experience switching events associated with sensing (e.g., reading) memory cells programmed to a particular state.

Memory systems may be implemented in electronic systems, such as computers, cell phones, hand-held electronic devices, etc. Some memory systems, such as solid state drives (SSDs), embedded Multi-Media Controller (eMMC) devices, Universal Flash Storage (UFS) devices, and the like may include non-volatile storage memories for storing host (e.g., user) data from a host. Non-volatile storage memories provide persistent data by retaining stored data when not powered and may include NAND flash memory, NOR flash memory, read only memory (ROM), Electrically Erasable Programmable ROM (EEPROM), Erasable Programmable ROM (EPROM), and resistance variable memory, such as phase change random access memory (PCRAM), three dimensional cross-point memory (e.g., 3D XPoint), resistive random access memory (RRAM), ferroelectric random access memory (FeRAM), magnetoresistive random access memory (MRAM), and programmable conductive memory, among other types of memory.

Memory cells can be arranged in an array architecture, and buffers with a set of registers can be coupled to the array such that data can be read from the array to the registers for subsequent transmission to the host or host data can be received at the registers and subsequently written to (e.g., programmed in) the array.

Memory cells can be programmable to a number of different data states corresponding to one or more data units (e.g., bits). As an example, some memory cells, such as some resistance variable memory cells, can be programmed to low resistance state, corresponding to a low threshold voltage (Vt) state or a high resistance state, corresponding to a high Vt state. In some examples, a resistance variable cell in a lower resistance state can be said to be in a set state, corresponding to a set Vt distribution (e.g., encoded as a logical 1), and a resistance variable cell in a higher resistance state can be said to be in a reset state, corresponding to a reset Vt distribution (e.g., encoded as a logical 0).

The state of a memory cell can be sensed by, for example, determining whether the cell changes its resistance state (e.g., experiences a switching event) in response to applying a sensing voltage, that may be referred to as a read voltage or a demarcation voltage, to (e.g., across) the cell. For example, memory cells having Vts less than the sensing voltage might experience a switching event, whereas memory cells having Vts greater than the sensing voltage might not. As such, the sensing voltage can be selected to be greater than the Vts corresponding to the set Vt distribution and less than the Vts corresponding to the reset Vt distribution so that memory cells that are in the set state experience a switching event in response to the sensing voltage.

DETAILED DESCRIPTION

The present disclosure is directed to technological improvements in counters that can be used to determine when a threshold quantity of events in electronic systems, such as memories and memory systems, is reached. For example, the threshold quantity of events can correspond to a particular number of ones in a data pattern that can correspond to a particular weight of the data pattern.

In an example, a counter can have a number of sensing components. Each respective sensing component can be configured to sense a respective event and can include a respective first capacitor configured to be selectively coupled to a second capacitor in response to the respective sensing component sensing the respective event. The second capacitor can be configured to be charged to a voltage by each respective first capacitor that is selectively coupled to the second capacitor. The counter can have a comparator with a first input coupled to the second capacitor and a second input coupled to a reference voltage corresponding to a threshold quantity of events. The comparator can be configured to output a signal indicative of the threshold quantity of events being sensed in response to the voltage of the second capacitor being greater than or equal to the reference voltage.

In some examples, the counter can advantageously sense a number of concurrent independent events. The events that can be sensed can include switching events associated with sensing resistance variable memory cells (e.g., of 3D XPoint memory) in the set state with a sensing voltage, switching events associated with switching circuitry being coupled to static voltages having a particular value, events associated with changing data values in a set of data registers, among others.

In some examples, the threshold quantity of events can be half the quantity of memory cells in a group of memory cells that experience a switching event in response to an increasing sensing voltage, such as an increasing sensing voltage ramp, being used to sense the group of memory cells. For example, the highest sensing voltage for which a switching event occurs for half the cells can correspond to the median value of the Vt distribution for the group of cells.

Figure 1:
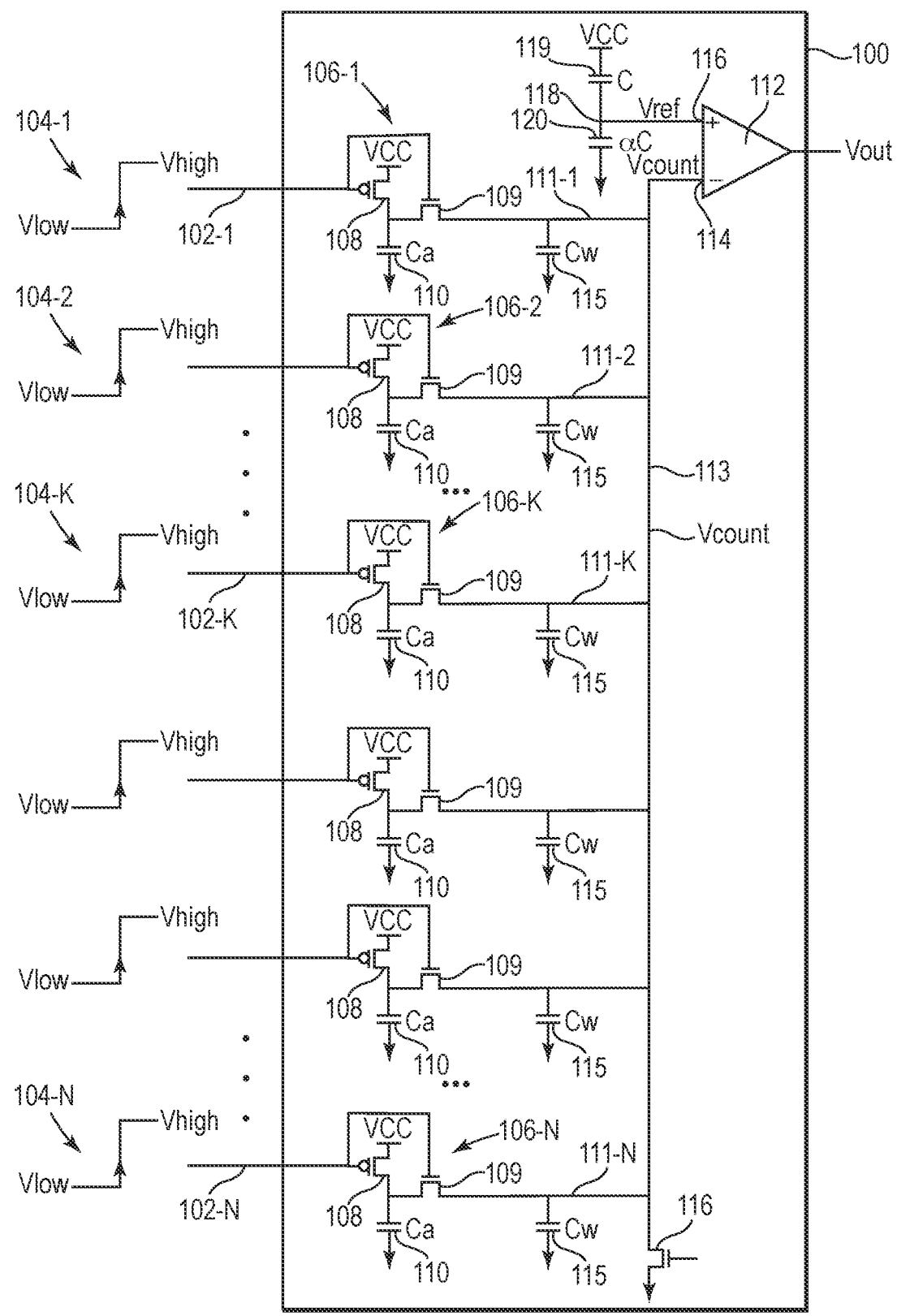
FIG. 1 illustrates a counter in accordance with a number of embodiments of the present disclosure.

FIG. 1 illustrates a counter 100, such as an event counter, in accordance with a number of embodiments of the present disclosure. For example, counter 100 can be used to count switching events, such as the various switching discussed herein.

In some examples, inputs 102-1 to 102-N of counter 100 can respectively receive voltage signals 104-1 to 104-N. For example, each of the respective voltage signals 104-1 to 104-N can initially be at a voltage Vlow (e.g., zero (0) volts) corresponding to a logic low (e.g., a logical 0). A respective voltage signal 104 can then go to a voltage Vhigh (e.g., a power supply voltage VCC), corresponding to a logic high (e.g., a logical 1), in response to a switching event. For example, the respective signal 104 can go to Vhigh in response to a resistance variable memory cell (e.g., at the set state) experiencing a switching event in response to a sensing voltage being applied to the memory cell. A respective signal 104 can remain at Vlow when a memory cell (e.g., at the reset state) does not experience a switching event in response to the sensing voltage being applied to the memory cell. For example, the voltage Vhigh can be indicative of a switching event, and the voltage Vlow can be indicative of no switching event.

Counter 100 includes a number of sensing components 106, such as sensing components 106-1 to 106-N respectively having inputs 102-1 to 102-N. Each of the respective sensing components 106-1 to 106-N includes a transistor 108, such as a p-channel transistor, and a transistor 109, such as an n-channel transistor. Each of the respective inputs 102-1 to 102-N is coupled to transistors 108 and 109 of each of the respective sensing components 106-1 to 106-N. Each of sensing components 106-1 to 106-N also includes a capacitor 110 having a capacitance Ca.

A capacitor 110 of each respective sensing component 106 is coupled to the transistors 108 and 109 of the respective sensing component 106. For example, capacitor 110 can be coupled between ground (0 volts) and transistors 108 and 109. Transistor 108 is coupled between a charging voltage that can be VCC and capacitor 110. For example, transistor 108 can be activated (e.g., turned ON) in response to Vlow to selectively couple VCC to capacitor 110 to charge capacitor 110 to VCC. For example, capacitor 110 can be coupled to VCC as long as the voltage at the respective input 102 is Vlow.

Sensing components 106-1 to 106-N are respectively couplable to branches 111-1 to 111-N that are coupled in parallel to a node 113. Counter 100 includes a comparator 112 having an input 114 coupled to node 113 and an input 116 coupled to receive a reference voltage Vref that corresponds to a threshold quantity of events respectively independently sensed by a threshold quantity of sensing components 106. Comparator 112 can compare Vref to a voltage Vcount on node 113 corresponding to a number of sensing components 106 respectively independently sensing independent events. For example, comparator 112 can output a voltage Vout indicative of a threshold quantity of events being sensed by counter 100 in response to Vcount greater than or equal to Vref.

The transistor 109 of a respective sensing component 106 is configured to selectively couple the respective sensing component 106 to a respective branch 111 in response to the respective voltage signal 104 going to Vhigh. Transistor 109 can be in a deactivated (e.g., turned OFF) when the voltage signal 104 is at Vlow, and can be activated in response to Vhigh to selectively couple the respective sensing component 106 to the respective branch 111. For example, transistor 109 can selectively couple the capacitor 110 of the respective sensing component 106 in parallel with each of (e.g., all of) the branches 111 in response to Vhigh. Note that transistor 108 can be turned OFF in response to Vhigh.

Respective capacitors 115, having a capacitance Cw, can be coupled between ground and respective ones of the branches 111-1 to 111-N. The N capacitors 115 are coupled in parallel to node 113 and can be initially discharged to ground. Although a capacitor 115 is coupled to each of branches 111-1 to 111-N in the example of FIG. 1, a capacitor 115 can be coupled to fewer than N branches. For example, in general, a capacitor 115 may be coupled to M of branches 111-1 to 111-M so that there a total of M capacitors 115 coupled in parallel to node 113. For example, M can be any integer from one (1) to N. For example, there can be a single capacitor 115 coupled between node 113 and ground.

A transistor 116, such as an n-channel transistor, can be coupled between node 113 and ground. For example, transistor 116 can be activated to initially discharge node 113 and capacitors 115 to ground. Transistor 116 can be subsequently deactivated after node 113 and capacitors 115 are discharged to ground.

In some examples, the capacitor 110 of each respective sensing component 106 can be selectively coupled in parallel with all M initially discharged capacitors 115 in response to the respective sensing component 106 sensing an event (e.g., while transistor 116 is deactivated). For example, the capacitor 110 of a respective sensing component 106 can be selectively coupled in parallel with all M capacitors 115 in response to the transistor receiving Vhigh. In some examples, the capacitor 110 of each respective sensing component 106 can be selectively coupled in parallel with the single capacitor 115 coupled between node 113 and ground.

When a subset of sensing components 106-1 to 106-N, such as K sensing components 106-1 to 106-K, sense an event, the K capacitors 110 of sensing components 106-1 to 106-K are coupled in parallel with M capacitors 115. As such, the K capacitors 110 can charge the M discharged capacitors 115 until the K capacitors 110 and the M capacitors 115 reach an equilibrium voltage equal to Vcount. For example, the K capacitors 110 can discharge from VCC into the M capacitors 115 until the Vcount is reached.

As a result, each of the branches 111-1 to 111-N and thus node 113 can go to Vcount=(VCC)(KCa)/(KCa+MCw)=VCC/(1+Mr/K) for r=Cw/Ca, giving VCC/(1+M/K) for Cw=Ca.

Vref can be the voltage at a node 118 between a capacitor 119, having a capacitance C coupled in series with a capacitor 120, having a capacitance aC. For example, capacitor 119 can be coupled between node 118 and a voltage, such as VCC, equal to the charging voltages for charging capacitors 110, and capacitor 120 can be coupled between node 118 and ground. As such, capacitors 119 and 120 can be coupled in series between VCC and ground. For example, Vref=VCC/(1+α).

Each sensing component can sense one event such that it takes a threshold quantity Kth of sensing components 106 to sense a threshold quantity Kth of events. Therefore, for Kth events $V_{countth} = VCC/(1+Mr/Kth) = VCC/(1+\alpha)$, giving $\alpha = Mr/Kth$. This allows $\alpha$, and thus Vref, to be specified for a particular number of capacitors M, a particular threshold quantity of events Kth, and a particular ratio of $r = Cw/Ca$. Note that counter 100 can sense concurrent events, such as events sensed concurrently by more than one sensing component 106.

The wires and transistors 108 and 109 of counter 100 can introduce parasitic capacitances. In some examples, these parasitic capacitances can be included in the capacitances Cw and/or Ca.

Figure 2:
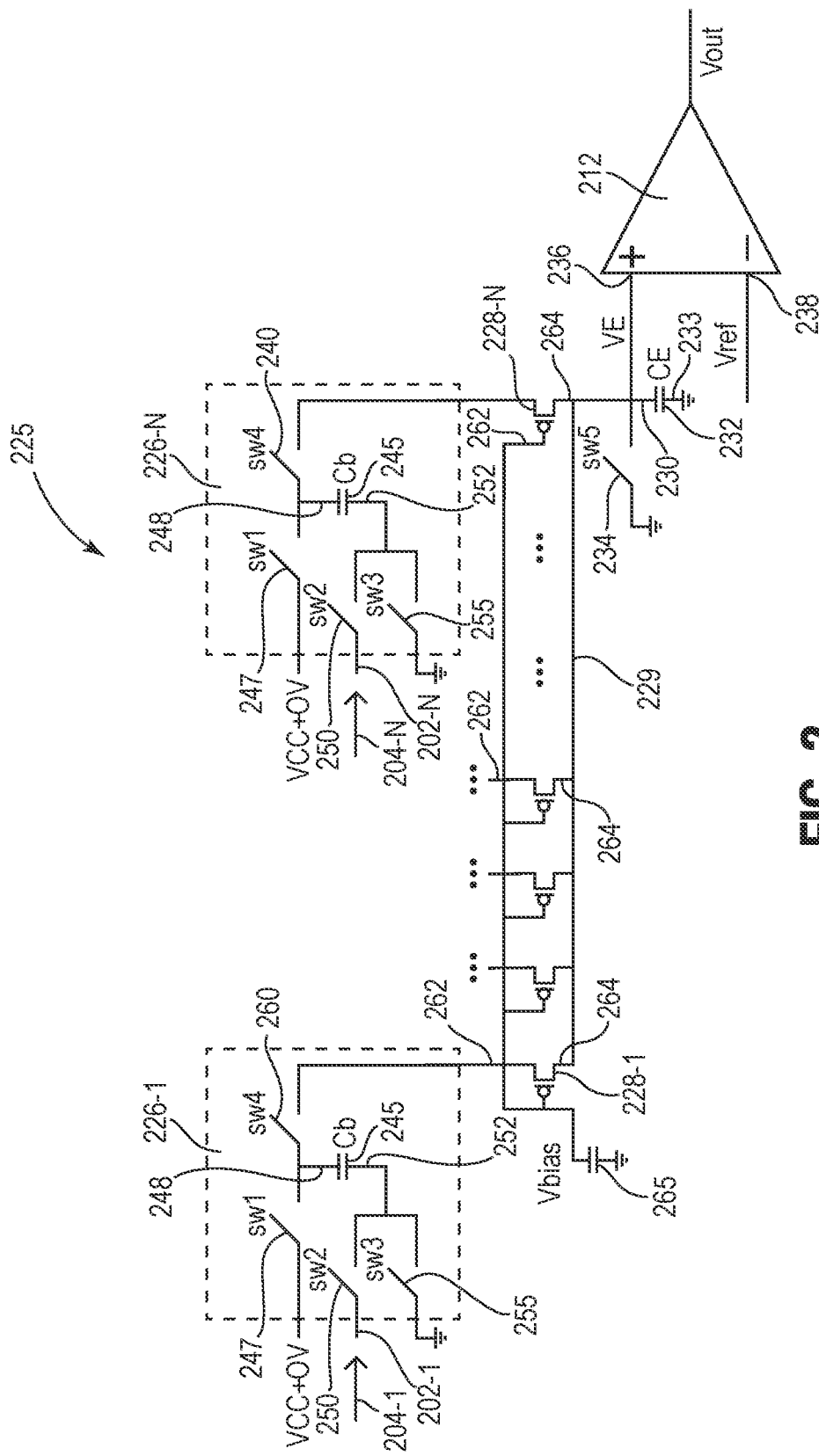
FIG. 2 illustrates another counter in accordance with a number of embodiments of the present disclosure.

FIG. 2 illustrates a counter 225, such as an event counter, in accordance with a number of embodiments of the present disclosure. For example, counter 225 can be used to count switching events, such as the various switching discussed herein.

In some examples, inputs 202-1 to 202-N of counter 225 can respectively receive voltage signals 204-1 to 204-N. Each of the respective voltage signals 204-1 to 204-N can be as previously described for voltage signals 104-1 to 104-N in conjunction with FIG. 1. For example, each of the respective voltage signals 204-1 to 204-N can initially be at the voltage Vlow (e.g., zero (0) volts). A respective voltage signal 204 can then go to the voltage Vhigh (e.g., VCC) in response to a switching event.

Counter 225 includes a number of sensing components 226, such as sensing components 226-1 to 226-N respectively having inputs 202-1 to 202-N. Sensing components 226-1 to 226-N are respectively coupled to transistors 228-1 to 228-N that can be p-channel transistors. For example, transistors 228-1 to 228-N can be coupled in parallel to a node 229 that is coupled to a terminal 230 of a capacitor 232 having a capacitance CE so that transistors 228-1 to 228-N coupled in parallel to terminal 230.

Transistors 228-1 to 228-N are configured to respectively selectively couple sensing components 226-1 to 226-N to node 229, and thus to terminal 230 of capacitor 230. A switch 234, such as switch sw5, is configured to selectively couple node 229, and thus terminal 230, to ground, for example. For example, switch sw5 can open and close to respectively selectively couple and decouple node 229 to and from ground in response to control signals being received by switch sw5. A terminal 233 of capacitor 232 can be coupled to ground, in some examples.

Counter 225 includes a comparator 212 having an input 236 coupled to node 229 and an input 238 coupled to receive a reference voltage Vref that corresponds to a threshold quantity of events respectively independently sensed by a threshold quantity of sensing components 226. Comparator 212 can compare Vref to a voltage VE on node 229, corresponding to a charge selectively placed capacitor 232 in response to a number of sensing components 226 respectively independently sensing independent events. For example, charges resulting from respective sensing components 226 sensing an event can be summed on node 229 and can charge capacitor CE to the voltage VE. Comparator 212 can output a voltage Vout indicative of a threshold quantity of events being sensed by counter 225 in response to VE greater than or equal to Vref.

Each of sensing components 226-1 to 226-N includes a capacitor 245 having a capacitance Cb. Each of sensing components 226-1 to 226-N includes a switch 247, such as a switch sw1. Switch sw1 can be configured to selectively couple a terminal 248 of the capacitor 245 of a respective sensing component 226 to a charging voltage, such as VCC+OV, "OV" being a over voltage that can be, for example, about 100 millivolts. For example, switch sw1 can open and close to respectively selectively couple and decouple the charging voltage to and from terminal 248 in response to control signals being received by switch sw1.

Each of sensing components 226-1 to 226-N includes a switch 250, such as a switch sw2. For example, switch sw2 can be configured to selectively couple a terminal 252 of the capacitor 245 of a respective sensing component 226 to a respective input 202 in response to an event. For example, switch sw2 can close to selectively couple terminal 252 to the input 202 in response to a respective voltage signal 204 going to Vhigh and can open to selectively decouple terminal 252 from the input 202 in response to the voltage signal 204 going to Vlow.

Each of sensing components 226-1 to 226-N includes a switch 255, such as a switch sw3. For example, switch sw3 can be configured to selectively couple terminal 252 of the capacitor 245 of a respective sensing component 226 to a voltage, such as ground. For example, switch sw3 can close to selectively couple terminal 252 to ground in response to a respective voltage signal 204 going to Vlow and can open to selectively decouple terminal 252 from ground in response to the voltage signal 204 going to Vhigh.

Each of sensing components 226-1 to 226-N includes a switch 260, such as a switch sw4. For example, switch sw4 can be configured to selectively couple terminal 248 of the capacitor 245 of a respective sensing component 226 to a respective transistor 228, such as a source/drain (e.g., a source) 262 of a respective transistor 228. For example, switch sw4 can open and close to respectively selectively couple and decouple terminal 248 to and from source 262 in response to control signals being received by switch sw4. A source/drain (e.g., a drain) 264 of each of the respective transistors 228-1 to 228-N is coupled to node 229. Note that a switch sw4 of a respective sensing component 226 and respective transistor 228 are configured to selectively couple the terminal 248 of the capacitor 245 of a respective sensing component 226 to node 229 and thus to capacitor 232.

A capacitor 265 can be coupled between ground, for example, and each of the respective transistors 228-1 to 228-N. For example, capacitor 265 can be charged to a biasing voltage Vbias so that the respective transistors 228-1 to 228-N are biased to Vbias.

Vbias can be about VCC minus the Vt of transistors 228-1 to 228-N. The Vt of transistors 228-1 to 228-N can be less than VCC and less than a voltage of the drain 264 for a range of operating conditions, such as operating temperatures, of counter 225. In some examples, the over voltage OV can compensate for a mismatch in the Vts of transistors 228-1 to 228-N. Note that counter 225 can sense concurrent events, such as events sensed concurrently by more than one sensing component 226.

Figure 3A:
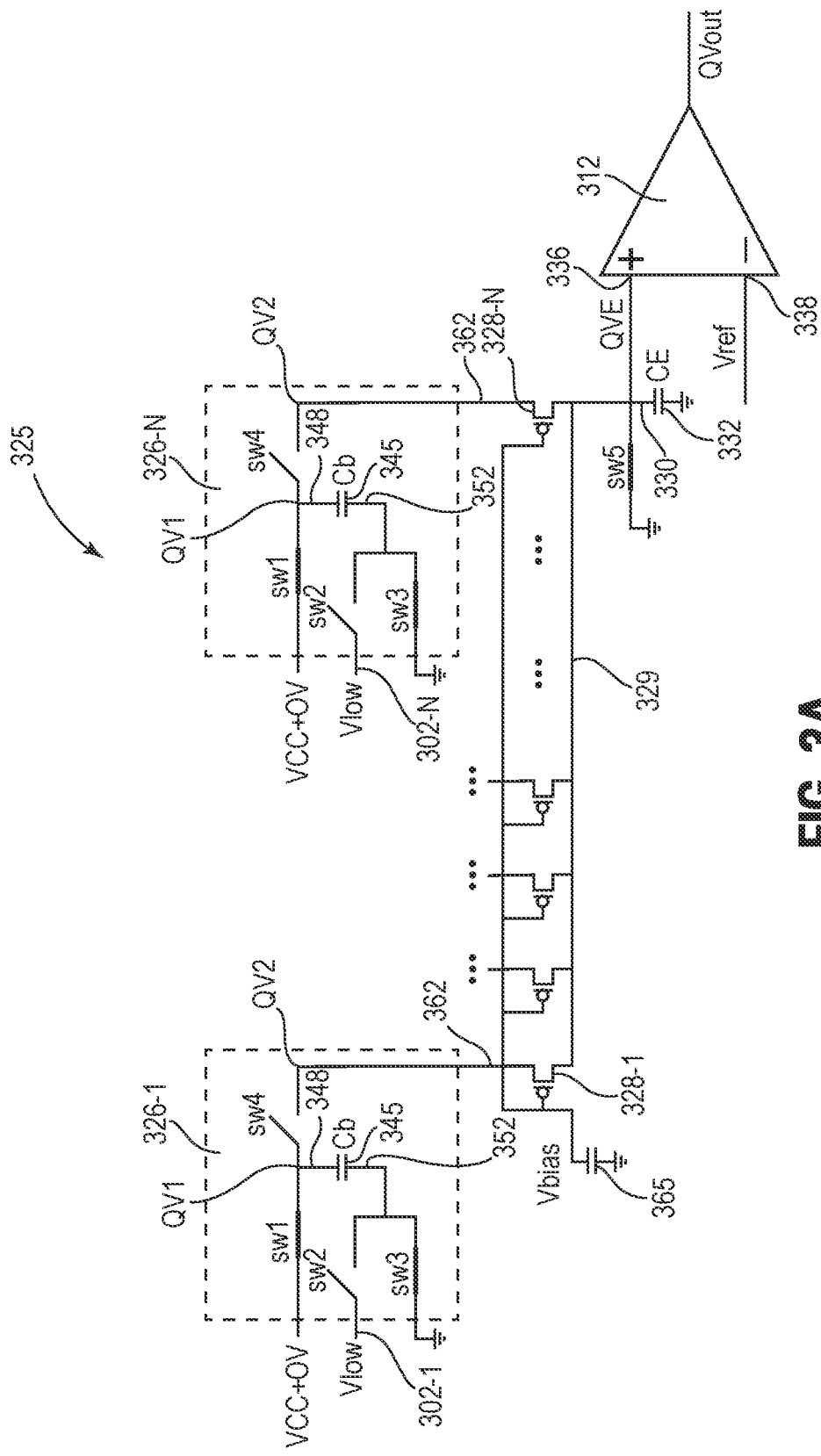
FIGS. 3A to 3C illustrate various configurations of a counter corresponding to particular stages of operation of the counter in accordance with a number of embodiments of the present disclosure.
Figure 3B:
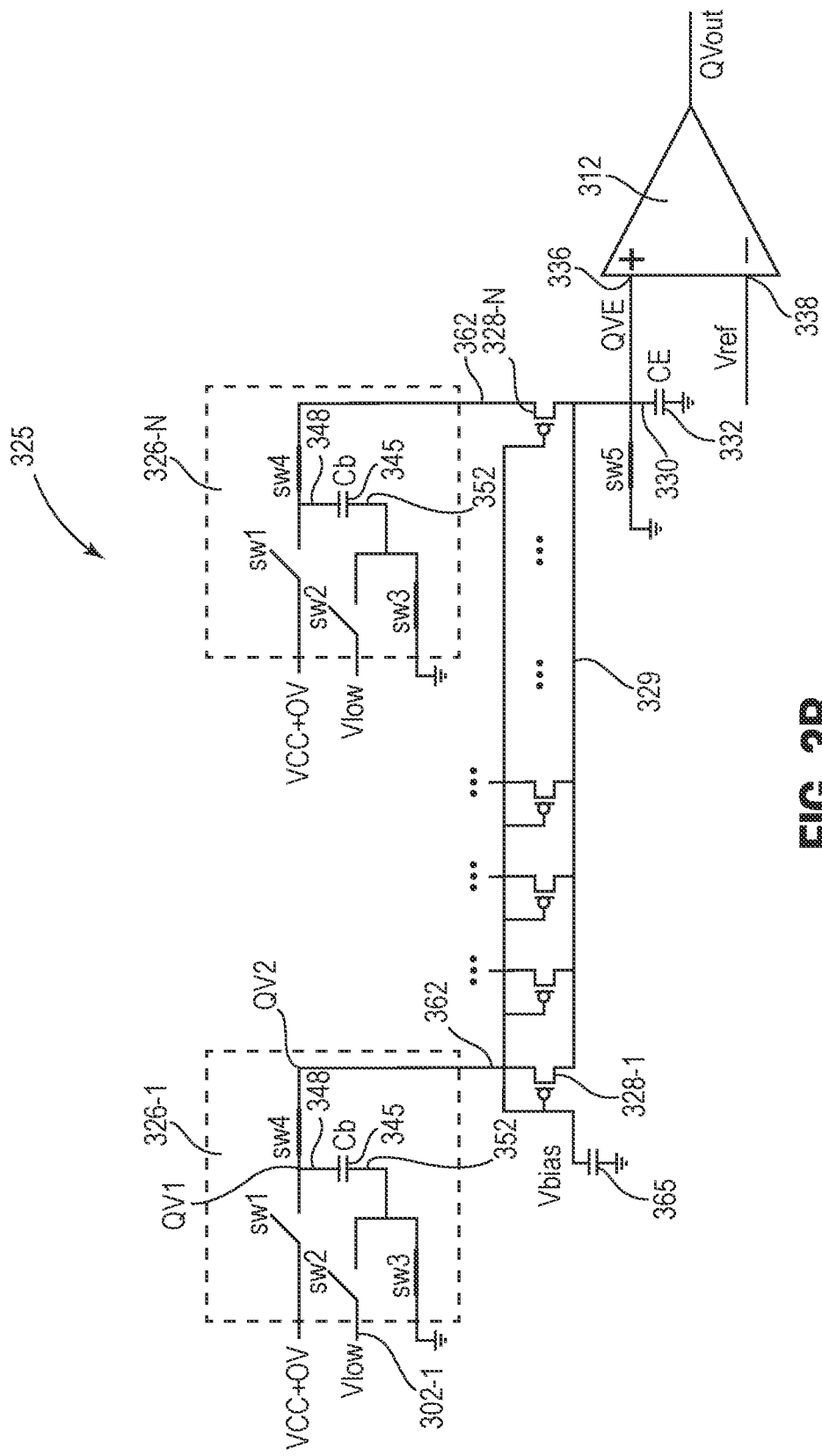
Figure 3C:
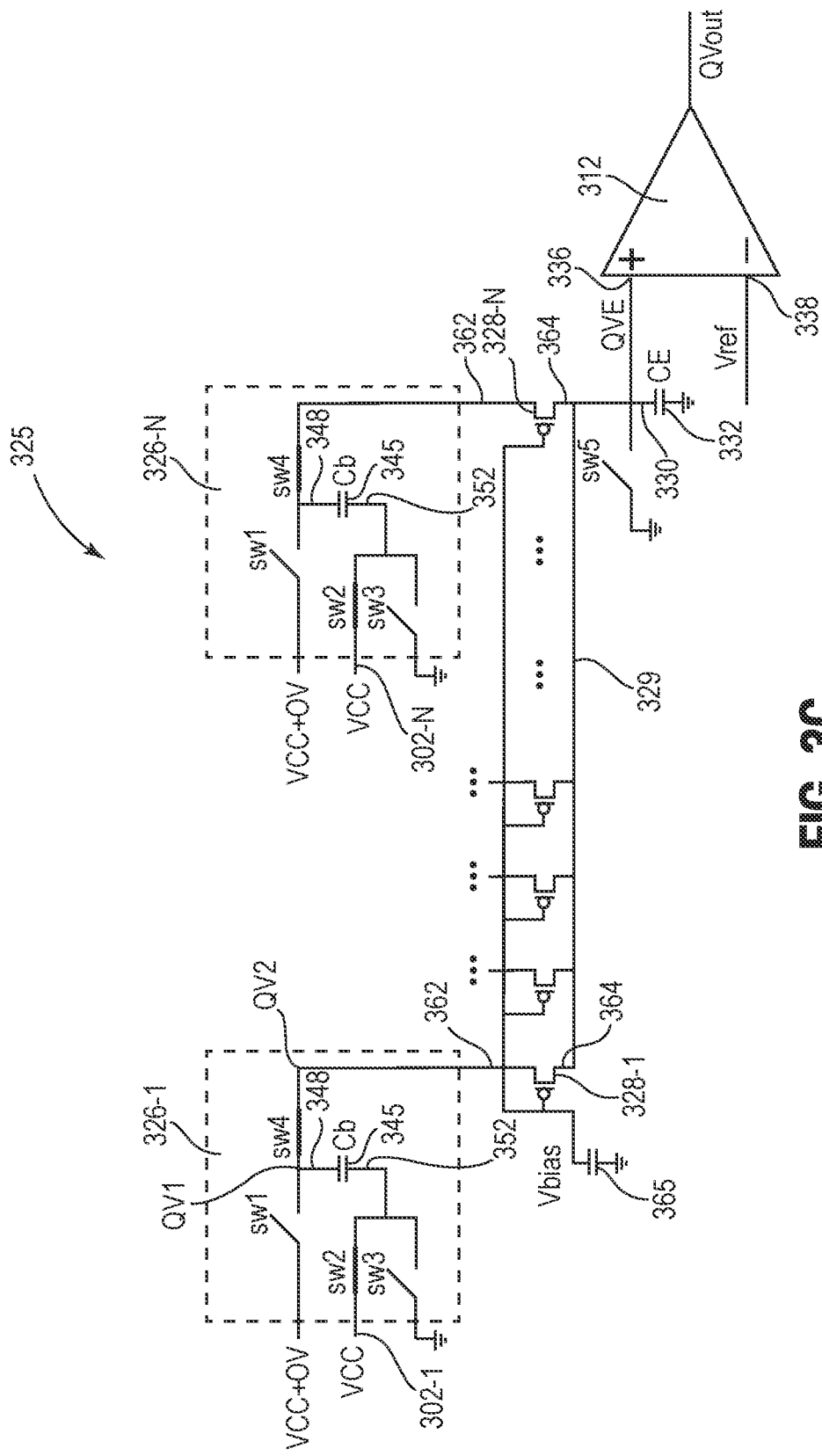
Figure 4:
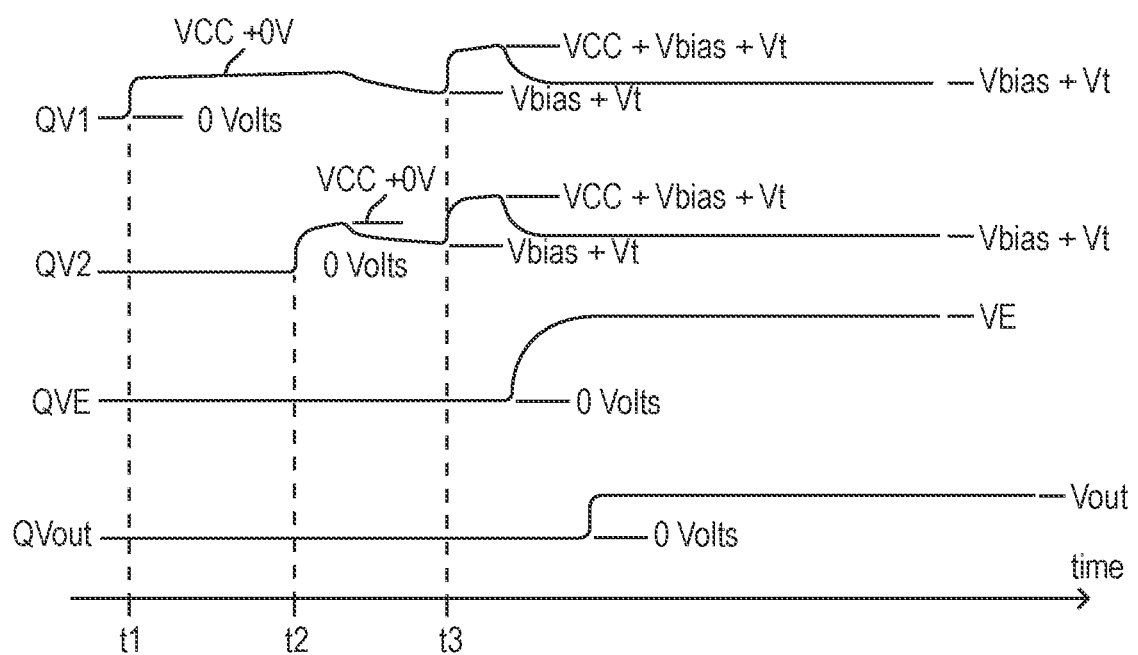
FIG. 4 illustrates various waveforms corresponding to the operation of a counter in accordance with a number of embodiments of the present disclosure.

FIGS. 3A to 3C illustrate various configurations of a counter 325 corresponding to particular stages of operation of counter 325 in accordance with a number of embodiments of the present disclosure. FIG. 4 illustrates various waveforms corresponding to the operation of counter 325 in accordance with a number of embodiments of the present disclosure.

FIG. 3A illustrates counter 325 selectively configured to initialize the sensing components 326-1 to 326-N in accordance with a number of embodiments of the present disclosure. In FIG. 3A, the capacitor 345 of each of the respective sensing components 326-1 to 326-N is pre-charged to a charging voltage, such as VCC+OV, in response to the switch sw1 of each respective sensing component 326 selectively coupling VCC+OV to the terminal 348 of the capacitor 345 while switch sw3 selectively couples terminal 352 of capacitor 345 to ground, while switch sw5 selectively couples node 329, terminal 330 of capacitor 332, and input 336 of comparator 312 to ground, while switches sw2 and sw4 are open, and while the voltage at each of inputs 302-1 to 302-N is at Vlow, for example.

FIG. 4 illustrates a waveform of a voltage signal QV1 at terminal 348 of the capacitor 345 of each of the respective sensing components 326-1 to 326-N. For example, at a time t1, the switch sw1 of the of each respective sensing component 326 and switch sw5 can be closed concurrently. Closing switch sw1 causes the voltage of QV1 to increase from 0 volts to VCC+OV. This charges capacitor 345 to VCC+OV (e.g., VCC+OV is across capacitor 345). For example, in FIG. 3A each of the respective sensing components 326-1 to 326-N is initialized by charging the capacitor 345 of each of the respective sensing components 326-1 to 326-N to VCC+OV.

FIG. 3B illustrates counter 325 selectively configured to initialize transistors 328-1 to 328-N of counter 325 in accordance with a number of embodiments of the present disclosure. For example, in FIG. 3B transistors 328-1 to 328-N are placed in the same conductive state (e.g., a non-conductive state) such that transistors 328-1 to 328-N are turned OFF. In FIG. 3B, switch sw1 is open and decouples terminal 348 of the capacitor 345 of each of the respective sensing components 326-1 to 326-N from the charging voltage VCC+OV while switch sw4 is closed to selectively couple the voltage signal QV1 at terminal 348 of capacitor 345 of each of the respective sensing components 326-1 to 326-N to the source 362 of each of the respective transistors 328-1 to 328-N. Switch sw2 remains open, and switches sw3 and sw5 remain closed.

FIG. 4 illustrates a waveform of a voltage signal QV2 at source 362 of each of the respective transistors 328-1 to 328-N. For example, at a time t2, the switch sw4 of each respective sensing component 326 closes to selectively couple QV2 to QV1. Selectively coupling QV2 to QV1, and thus terminal 348 of capacitor 345 to the source 362 of a respective transistor 328, causes the voltage of voltage signal QV2 go from 0 volts to VCC+OV. This causes the respective transistors 328-1 to 328-N to conduct and a current to flow from the capacitor 345 of each of the respective sensing components 326-1 to 326-N to ground via node 329.

For example, capacitors 345 discharge into node 329 from VCC+OV to Vbias+Vt, Vbias being the voltage on the gates of transistors 328-1 to 328-N and Vt being the threshold voltage of a respective transistor 328. For example, the voltages of voltage signals QV1 and QV2 decrease from VCC+OV to Vbias+Vt, as shown in FIG. 4. The respective transistors 328 can turn OFF in response to QV2 reaching Vbias+Vt and are thus placed in the same non-conductive state.

Note that the Vts of the respective transistors 328 can be different so that Vbias+Vt can be different on the sources 362 each of the respective transistors 328-1 to 328-N. In some examples, the currents flowing through the respective transistors 328 can become equal as capacitors 345 discharge.

FIG. 3C illustrates counter 325 during a sensing operation in accordance with a number of embodiments of the present disclosure. In FIG. 3C, each of the N sensing components 326-1 to 326-N is sensing an independent event that causes the voltage at each of the respective inputs 302-1 to 302-N go to VCC from Vlow.

In response to VCC, the switch sw3 of each respective sensing component 326 opens to selectively decouple the terminal 352 of the capacitor 345 of each respective sensing component 326 from ground, and the switch sw2 of each respective sensing component 326 closes at a time t3 to selectively couple the terminal 352 of the capacitor 345 of each respective sensing component 326 to VCC, while switches sw1 remain open. Note that switch sw5 can be opened after QV2 reaches Vbias+Vt so that node 329, input 336 to comparator 312, and terminal 330 of capacitor 332 are coupled to the drains 364 of transistors 328-1 to 328-N.

Starting at time t3, voltage signals QV1 and QV2 increase from Vbias+Vt to VCC+Vbias+Vt in response to switch sw2 selectively coupling VCC to terminal 352 of capacitor 345, as shown in FIG. 4. For example, the voltage across capacitor 345 can be preserved at Vbias+Vt. Each respective transistor 328 is activated in response to VCC+Vbias+Vt so that node 329, input 336 to comparator 312, and terminal 330 of capacitor 332 are selectively coupled to the terminal 348 of the capacitor 345 of each respective sensing component 326 by the switch s4 of the respective sensing component 326 and the respective activated transistor 328.

The capacitor 345 of each respective sensing component 326 discharges into node 329, and thus into capacitor 332, in response to each respective transistor 328 being activated. As shown in FIG. 4, each capacitor 345 discharges until the voltage of voltage signals QV1 and QV2 is reduced by VCC and is returned to Vbias+Vt, at which voltage the respective transistors 328 are deactivated. As such, a charge in the amount of CbVCC is transferred to capacitor 332 from each capacitor 345 during the discharge.

The voltage signal QVE on terminal 330 of capacitor 332 goes from 0 volts to the voltage VE in response to the charge being transferred from each capacitor 345, as shown in FIG. 4, so that capacitor 332 is charged to the voltage VE. The charge transferred to capacitor is CEVE and is equal the sum of the charges CbVCC from capacitors 345. For example, for N sensing components respectively sensing N independent events, the sum of the charges CbVCC is NCbVCC.

Note that fewer than N independent events, such as K independent events, can be respectively independently sensed by K sensing components, in which case the sum of the K charges is KCbVCC, and thus a charge of KCbVCC is transferred to capacitor 332 to produce a charge CEVE of capacitor 332. For example, CEVE=KCbVCC, giving VE=(KCbVCC)/CE. Note that VE is directly proportional to K, and VE is a linear function of K. This is a result of the charge CbVCC being transferred to capacitor 332 from each of the K sensing components. For example, each sensing event causes the same amount of charge to be transferred to capacitor 332, and thus can increase the charge on capacitor 332 by the same amount. This due, at least in part, to the initialization of transistors 228 describe previously in conjunction with FIG. 3B.

Each sensing component 326 can sense one event such that it takes a threshold quantity Kth of sensing components 326 to sense a threshold quantity Kth of events. For example, Vref can correspond to a threshold quantity Kth of events sensed by Kth of sensing components 326. Therefore, Vref=VEth=(KthCbVCC)/CE. For example, as shown in FIG. 4, the voltage signal QVout at the output of comparator 312 can go from 0 volts to Vout in response to VE being greater than or equal to Vref.

Note that the voltage step in response to each sensed event is ΔVE=(VCCCb/CE). For example, Cb/CE can be selected to give a larger ΔVE. It follows from Vref=(KthCbVCC)/CE that Cb/CE=Vref/KthVCC. However, Vref should be less than VCC. In some examples, Vref can be VCC−VM, giving Cb/CE=(VCC−VM)/KthVCC. For example, the voltage VM can provide a voltage margin that can act protect against saturation effects that can act to alter the dependence VE on K for values of K above a particular level.

In some examples, Vref can be selected to be between, such as halfway between, the voltage corresponding to VE at the threshold quantity Kth, VEth=(KthCbVCC)/CE, and the voltage corresponding to VE at Kth−1, one count less than Kth, VEth=[(Kth−1)CbVCC]/CE. For example, Vref might be [(Kth−(½))CbVCC]/CE so that VE does not exceed Vref until the number of events reaches Kth.

The wires and transistors 328 of counter 325 can introduce parasitic capacitances. In some examples, these parasitic capacitances can be included in the capacitances Cb and/or CE.

Figure 5:
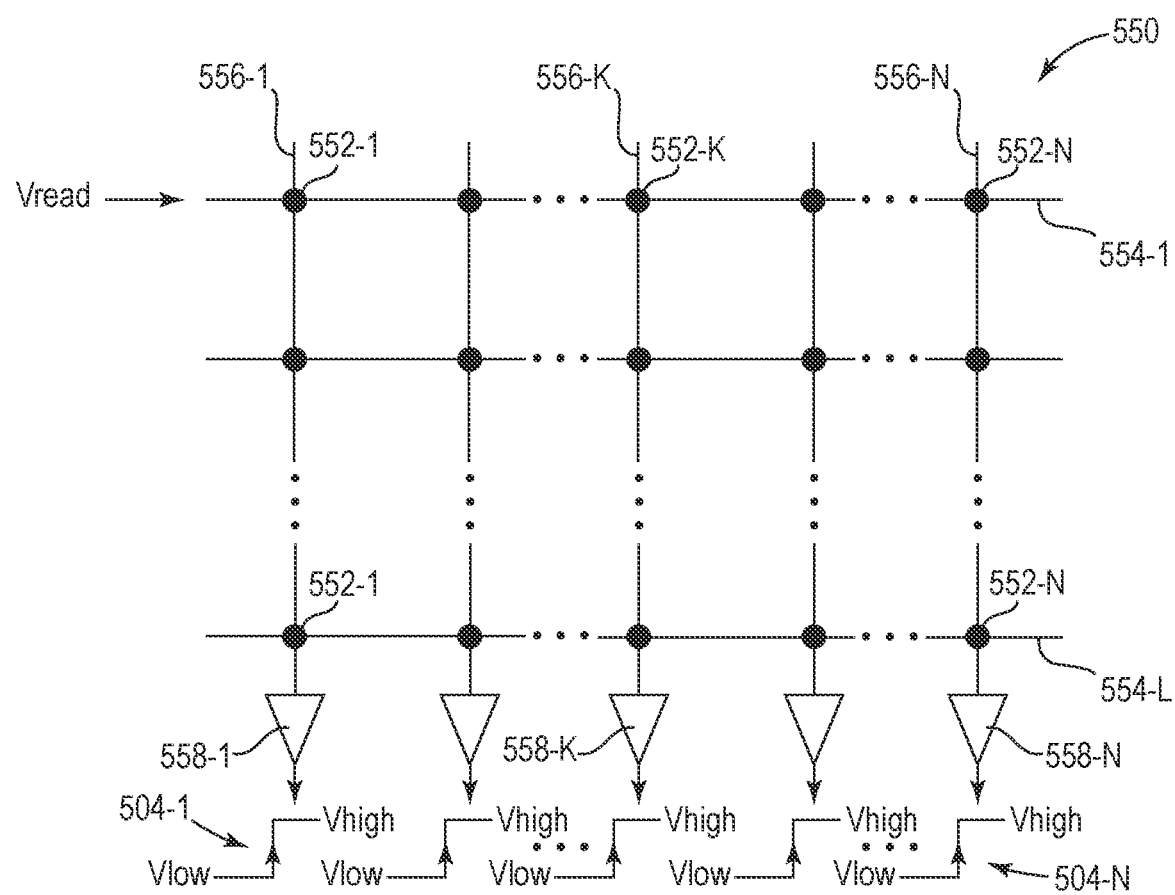
FIG. 5 illustrates a portion of an array of memory cells in accordance with a number of embodiments of the present disclosure.

FIG. 5 illustrates a portion of an array 550 of resistive variable memory cells 552 in accordance with a number of embodiments of the present disclosure. In some examples, array 550 can be a tier of a 3D XPoint array that can include a stack of such tiers.

Array 550 incudes a respective group of resistive variable memory cells 552-1 to 552-N commonly coupled to each of access lines 554-1 to 554-L that can be referred to as word lines. The respective memory cells 552-1 to 552-N are respectively coupled to respective data lines 556-1 to 556-N that can be referred to as bit lines. For example, there is a memory cell 552 at each data-line-access-line crossing. Sense amplifiers 558-1 to 558-N are respectively coupled to data lines 556-1 to 556-N. Sense amplifiers 558-1 to 558-N can be respectively coupled to the inputs 102-1 to 102-N of counter 100, inputs 202-1 to 202-N of counter 225, or inputs 302-1 to 302-N of counter 325.

In some examples, each group of memory cells 552-1 to 552-N can store a data pattern, such as a pattern of zeros and ones. A data pattern, such as a data pattern stored in the group of memory cells 552-1 to 552-N coupled to access line 554-1, can be read by applying a read voltage Vread to access line 554-1 while a voltage, that can be 0 volts, is applied to data lines 556-1 to 556-N to produce a voltage Vread minus 0 volts across memory cells 552-1 to 552-N. In some examples, Vread can be an increasing ramp voltage.

In some examples, the memory cells of the group of memory cells 552-1 to 552-N that store a one can experience a switching event in response to Vread that can cause the corresponding sense amplifiers to go from Vlow to Vhigh, whereas the memory cells of the group of memory cells 552-1 to 552-N that store a zero might not experience a switching event in response to Vread. Note, for example, that due to cell-to-cell variations, not all cells that store a one undergo the switching event simultaneously, for example, variations in the Vt result in respective cells switching at different times during an increasing ramped voltage Vread. By sensing the switching events, counters 100, 225, and 325 can determine whether the quantity of switching events, and thus the quantity of ones in the data pattern, is greater than or equal to the threshold quantity Kth.

The quantity of ones in a data pattern can be referred to as the weight, such as the Hamming weight, of the data pattern. For example, Kth can correspond to the weight of a data pattern being read, and counters 100, 225, and 325 can determine whether a data pattern has a particular weight. As such, counters 100, 225, and 325 can be referred to as weighers.

Figure 6:
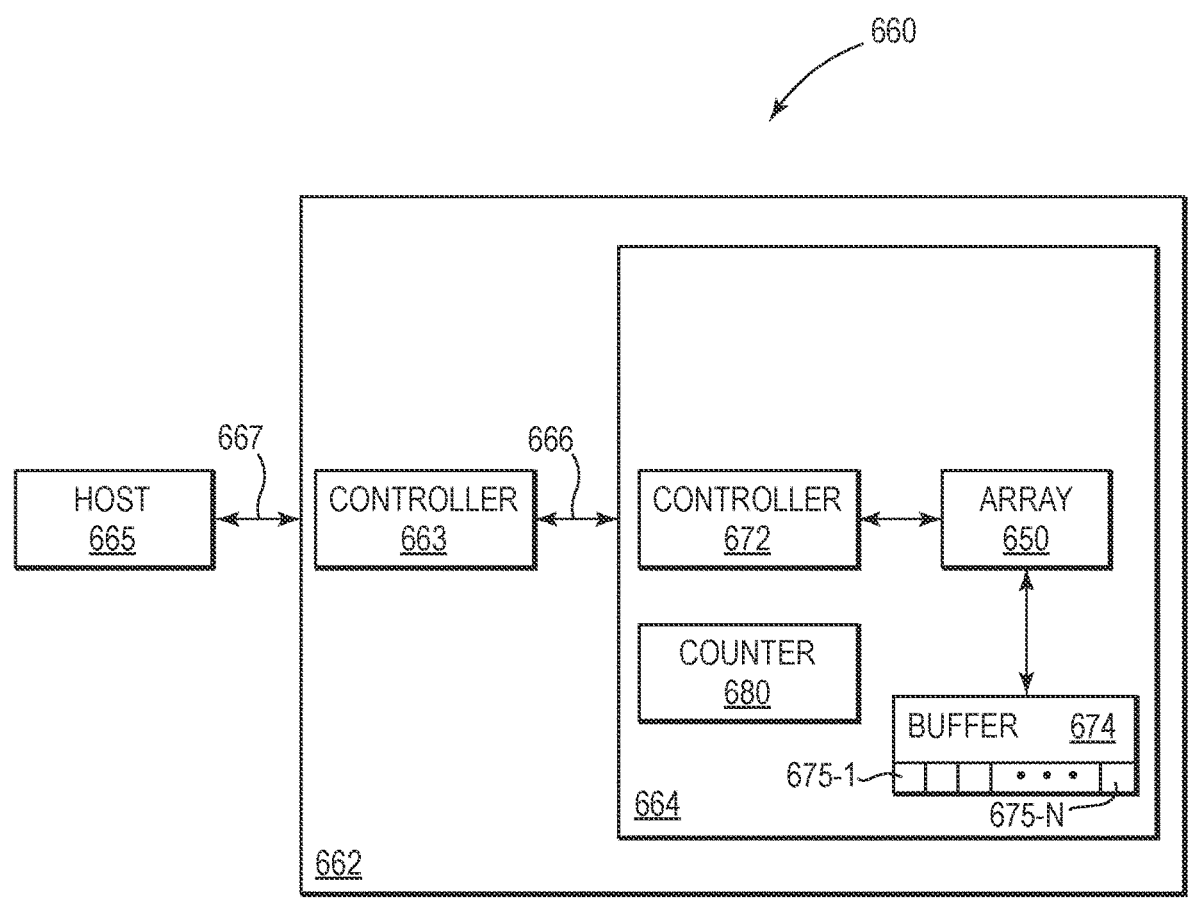
FIG. 6 is a block diagram of an apparatus in accordance with a number of embodiments of the present disclosure.

FIG. 6 is a block diagram of an apparatus in the form of a computing system 660 in accordance with a number of embodiments of the present disclosure. Computing system 660 includes a memory system 662 that can be, for example, a storage system such as an SSD, a UFS device, an eMMC device, etc. However, embodiments are not limited to a particular type of memory system. For example, memory system 622 could serve as main memory for system 660.

As shown in FIG. 6, memory system 662 can include a controller 663 that may be referred to as a memory system controller, in that controller 663 can control a memory 664. Controller 663 is coupled to a host 665 and to memory 664. For example, memory 664 can include a number of memory devices (e.g., dies, chips, etc.) and can serve as a memory (e.g., main memory) and/or as a storage volume for computing system 660.

Memory 664 can be coupled to controller 663 via an interface 666 (e.g., memory interface) that can include a data bus and that can support various standards and/or comply with various interface types, such as double data rate (DDR), etc. Controller 663 can receive commands, such as read and write commands from host 665. Controller 663 can, for example, receive host data to be written to memory 664 from host 665 via a host interface 667. As used herein, a memory system 662, a controller 663, a memory 664, a controller 672, or a counter 680 might also be separately considered an "apparatus."

Host 665 can be, for example, a host system, such as a personal laptop computer, a desktop computer, a digital camera, a mobile device (e.g., cellular phone), network server, Internet of Things (IoT) enabled device, or a memory card reader, among various other types of hosts. For instance, host 665 can include one or more processors capable of accessing memory 664 (e.g., via controller 663) over interface 667 that can include a bus. Interface 667 may be a standardized interface, such as a serial advanced technology attachment (SATA), peripheral component interconnect express (PCIe), or a universal serial bus (USB), among various others.

Memory 664 can include a number of memory arrays 650 (e.g., referred to collectively as array 650) and a controller 672 that may be referred to as an embedded controller. In some examples, array 650 can include 2D and/or 3D array structures, such as cross point (e.g., 3D XPoint) array structures. Array 650 can include, for example, non-volatile resistance variable memory cells, such as those employing 3D XPoint technology. For example, array 650 can be array 550.

Controller 672 can be located internal to the memory 664, and can receive commands (e.g., write commands, read commands, etc.) from the controller 663 via the memory interface 666. Controller 662 can include a state machine and/or a sequencer. Controller 672 can be configured to control the operation of memory 664. A data buffer 674 can be coupled to array 650. For example, data can be read from array 650 into buffer 674, or host data can be received at buffer 674 from controller 663 and subsequently written to array 650.

Memory 664 can include a counter 680 that can be counter 100, 225, or 325. Counter 680 can sense a number of events occurring in memory 664. For example, counter 680 can determine whether a threshold quantity of memory cells of a group of memory cells in array 650 experience a switching event in response to a read voltage, and thus whether a data pattern stored in the group of memory cells has a particular weight.

In some examples, inputs of counter 680 can be respectively coupled to the wires of the data bus. For example, the respective inputs of counter 680 can be coupled to respective registers of a set of registers 675-1 to 675-N of buffer 674 so that counter 680 can sense switching events associated with receiving a data pattern in the set of registers from array 650 during a read operation or from host 665 during a write operation. In some examples, registers 675-1 to 675-N can be respectively coupled to the inputs of counter 680. In some examples, the set of registers might initially store a pattern of all zeros, and counter 680 may sense switching events corresponding to registers whose values are changed to ones as a result of receiving the data pattern at the set of registers during a read or a write. As a result, counter 680 can determine whether the data pattern received at buffer 674 has a threshold quantity of ones, and thus a particular weight.

In some examples, each respective input of counter 680 can include a respective switching circuit that can experience a switching event in response to being coupled to a static voltage, such as Vhigh, and that does not experience a switching event in response to being coupled to a different static voltage, such as Vlow. Counter 680 can then sense the switching events experienced by the switching circuit.

In some examples, the respective inputs can be coupled to respective registers at static voltages corresponding to the data values stored by the respective registers (e.g., of buffer 674). For example, Vhigh can correspond to a logical one, and Vlow can correspond to a logical zero. Counter 680 can then sense the switching events corresponding to the registers storing logical ones. As such, counter 680 can determine whether the data pattern stored by the registers has threshold quantity of ones, and thus a particular weight.

In the preceding detailed description, reference is made to the accompanying drawings that form a part hereof, and in which is shown, by way of illustration, specific examples. In the drawings, like numerals describe substantially similar components throughout the several views. Other examples may be utilized, and structural, logical, and/or electrical changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 202 may reference element "02" in FIG. 2, and a similar element may be referenced as 302 in FIGS. 3A to 3C. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship).

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

What is claimed is:

1. An apparatus, comprising:
   a memory comprising an array of memory cells; and
   a counter coupled to the memory and comprising a plurality of sensing components and a comparator;
   wherein the counter is configured to:
      receive a respective first voltage indicative of a respective event at each respective sensing component of a number of the plurality of sensing components, each respective sensing component comprising a respective first capacitor initially charged to a second voltage;
      transfer a particular amount of charge from each respective first capacitor into a second capacitor by discharging each respective first capacitor into the second capacitor in response to each respective sensing component receiving the respective first voltage so that the second capacitor is charged to a third voltage; and
      determine whether the number of the plurality of sensing components receiving the respective first voltage is greater than or equal to a threshold quantity by comparing the third voltage to a reference voltage provided to the comparator.

2. The apparatus of claim 1, wherein the third voltage is directly proportional to the number of the plurality of sensing components receiving the respective first voltage.

3. The apparatus of claim 1, wherein each respective first capacitor has a same associated capacitance.

4. The apparatus of claim 1, wherein each respective first capacitor is coupled to a first terminal of the second capacitor via a respective transistor.

5. The apparatus of claim 1, wherein the counter comprises a switch configured to initialize the counter by discharging the second capacitor.

6. The apparatus of claim 1, wherein the respective first voltage is received as part of a sensing operation performed on the memory.

7. The apparatus of claim 6, wherein the sensing operation involves applying a ramp voltage to a group of memory cells in the array.

8. The apparatus of claim 1, wherein the event comprises a threshold voltage switching event.

9. The apparatus of claim 1, wherein the counter is configured to detect concurrent switching events.

10. A method, comprising:
    applying a sensing voltage to a group of memory cells commonly coupled to an access line of a memory array, wherein data values stored in the group of memory cells are determined by respective sense amplifiers;
    providing, to a counter coupled to the memory array, respective voltages indicating whether the memory cells of the group experienced a switching event responsive to application of the sensing voltage;
    wherein the counter comprises:
       a plurality of sensing components, each respective sensing component comprising a respective first capacitor configured to be selectively coupled to a second capacitor in response to the counter receiving the respective voltages indicating whether the memory cells of the group experienced the switching event; and a comparator comprising a first input coupled to the second capacitor, the comparator configured to output a signal indicative of a quantity of memory cells of the group that experienced the switching event in response to the applied sensing voltage.

11. The method of claim 10, wherein the sensing voltage comprises an increasing ramp voltage.

12. The method of claim 10, wherein a second input of the comparator is coupled to a reference voltage corresponding to a threshold quantity of memory cells of the group that experience the switching event in response to the applied sensing voltage.

13. The method of claim 12, wherein the output signal of the comparator indicates whether the quantity of memory cells of the group that experienced the switching event in response to the applied sensing voltage is above the threshold quantity of memory cells.

14. The method of claim 12, further comprising determining a weight of a data pattern stored in the group of memory cells based on the output signal of the comparator.

15. A memory system, comprising:
an array of memory cells; and
a counter coupled to the array and configured to determine a weight of a data pattern stored in a group of memory cells in the array;

wherein the counter comprises:
a plurality of sensing components corresponding to respective memory cells of the group, each sensing component comprising a respective first capacitor configured to discharge to a second capacitor in response to the respective memory cell experiencing a switching event; and
a comparator comprising a first input coupled to the second capacitor and a second input coupled to a reference voltage corresponding to the weight of the data pattern.

16. The system of claim 15, wherein the respective first capacitors are each coupled to the comparator through a respective transistor.

17. The system of claim 15, wherein the comparator is configured to output a signal indicative of a threshold quantity of memory cells of the group having experienced the switching event.

18. The system of claim 15, wherein the switching event corresponds to an applied sensing voltage exceeding a threshold voltage of a respective memory cell of the group.

19. The system of claim 18, wherein the applied sensing voltage is a ramp voltage, and wherein the ramp voltage is discontinued from being applied to the group of memory cells responsive to the voltage corresponding to the second capacitor reaching or exceeding the reference voltage.

20. The system of claim 15, wherein the memory cells of the group of memory cells each comprise a chalcogenide material.

* * * * *